(12) United States Patent
Seto (10) Patent No.: US 7,629,263 B2
(45) Date of Patent: Dec. 8, 2009

(54) SEMICONDUCTOR SENSOR PRODUCTION METHOD AND SEMICONDUCTOR SENSOR

(75) Inventor: Masami Seto, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 542 days.

(21) Appl. No.: 11/489,134

(22) Filed: Jul. 18, 2006

(65) Prior Publication Data
US 2007/0037310 A1 Feb. 15, 2007

(30) Foreign Application Priority Data
Jul. 29, 2005 (JP) ............................. 2005-220006

(51) Int. Cl.
*H01L 21/302* (2006.01)
*H01L 21/461* (2006.01)

(52) U.S. Cl. .............. 438/736; 438/50; 257/E21.232

(58) Field of Classification Search .......... 438/50, 438/51, 701, 735–737, 978, FOR. 108, FOR. 458, 438/FOR. 492; 257/E21.218, E21.232, E21.536; 73/514.32–514.34

See application file for complete search history.

(56) References Cited

U.S. PATENT DOCUMENTS 6,458,615 B1 * 10/2002 Fedder et al. ............... 438/50
7,350,424 B2 * 4/2008 Hjelt et al. ................ 73/862.041
2006/0141786 A1 * 6/2006 Boezen et al. ............... 438/689
2006/0272414 A1 * 12/2006 Ayazi et al. ............... 73/514.32
2008/0196497 A1 * 8/2008 Suzuki .................... 73/504.02

FOREIGN PATENT DOCUMENTS

JP 2003-270262 9/2003
JP 2005-049130 2/2005

* cited by examiner

*Primary Examiner*—Matthew Smith
*Assistant Examiner*—Quovaunda Jefferson
(74) *Attorney, Agent, or Firm*—Cooper & Dunham, LLP

(57) ABSTRACT

A semiconductor sensor production method includes the steps of (A) forming a first etching mask layer on a support part segment of a backside semiconductor layer, except on a portion of the support part segment which portion is along edges of the support part segment; (B) forming a second etching mask layer on the support part segment and a proof mass part segment of the backside semiconductor layer; (C) selectively removing segments of the back side semiconductor layer between the proof mass part segment and the support part segment by performing etching; (D) making the proof mass part segment of the back side semiconductor layer thinner than the support part segment of the back side semiconductor layer by performing etching; and (E) removing the first etching mask layer by using a wet etching method.

4 Claims, 6 Drawing Sheets

SEMICONDUCTOR SENSOR PRODUCTION METHOD AND SEMICONDUCTOR SENSOR

BACKGROUND OF THE INVENTION

1. Field of the Invention

The present invention generally relates to a semiconductor sensor production method and a semiconductor sensor produced by using such a method, and more particularly relates to a method of producing a semiconductor sensor using piezoresistors, such as a semiconductor acceleration sensor or a semiconductor angular rate sensor, and a semiconductor sensor produced by using such a method.

A semiconductor sensor is used, for example, to measure acceleration applied to a moving automobile in the direction of travel or in the lateral direction; or to measure camcorder shake.

2. Description of the Related Art

A semiconductor multi-axis acceleration sensor having sensitivity to acceleration in multiple directions is known as an example of a semiconductor acceleration sensor using piezoresistors (refer to patent document 1, for example).

Figure 4A:
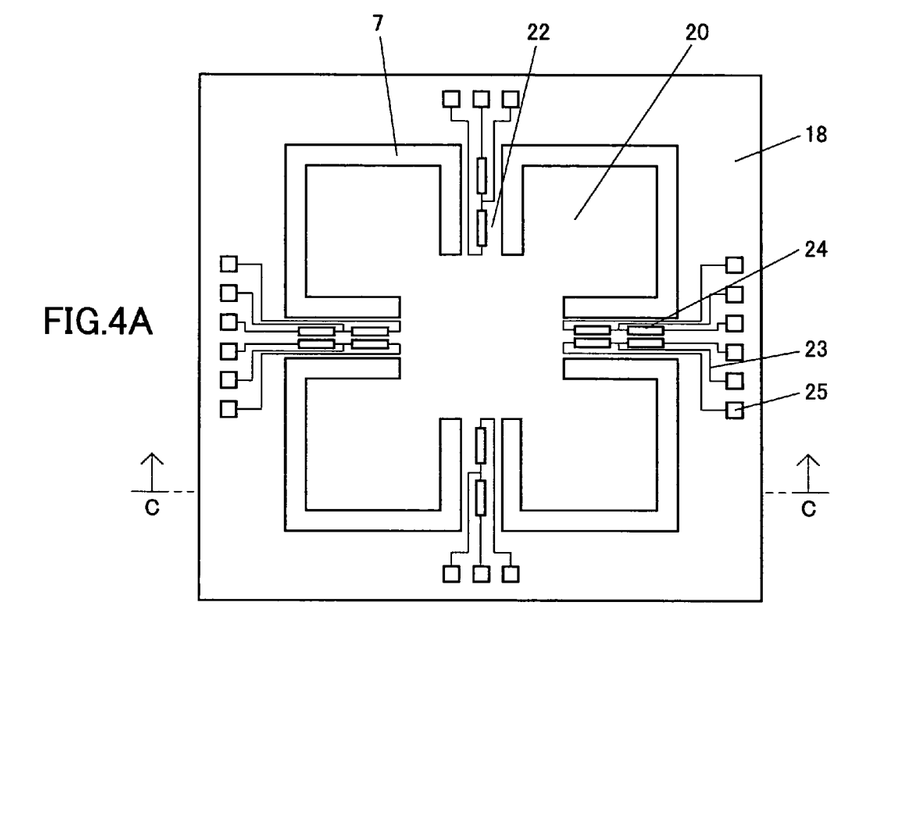
FIG. 4A is a plan view of an exemplary conventional semiconductor sensor.
Figure 4B:
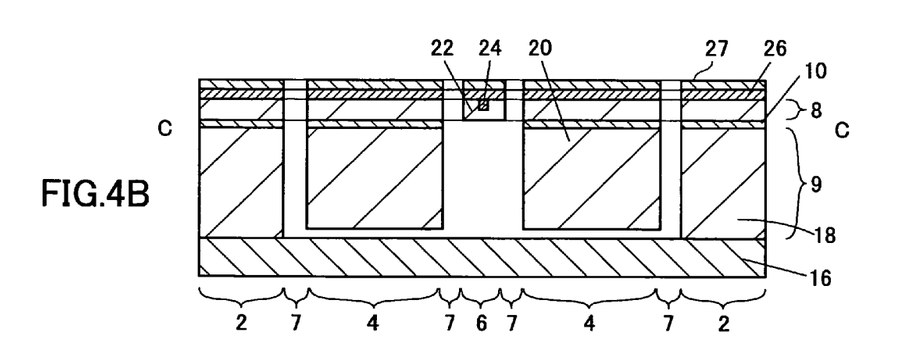
FIG. 4B is a cross-sectional view of the conventional semiconductor sensor taken along line C-C shown in FIG. 4A.

FIG. 4A is a plan view of an exemplary conventional semiconductor sensor. FIG. 4B is a cross-sectional view of the exemplary conventional semiconductor sensor taken along line C-C shown in FIG. 4A. In FIG. 4B, 2 indicates a support part segment, 4 indicates a proof mass part segment, 6 indicates a beam part segment, 7 indicates an opening segment where substrate material is removed in the thickness direction, 8 indicates a front side silicon layer of an SOI substrate, 9 indicates a back side silicon layer of the SOI substrate, and 10 indicates a buried oxide film formed between the front side silicon layer 8 and the back side silicon layer 9. In FIG. 4A, illustration of a passivation film is omitted, and, instead, wiring patterns 23 and piezoresistors 24 are illustrated. In FIG. 4B, illustration of the wiring patterns 23 is omitted.

The exemplary conventional semiconductor sensor includes a proof mass part 20 which is bent according to acceleration and a frame-shaped support part 18 formed around the proof mass part 20. The opening segments 7 are positioned between the support part 18 and the proof mass part 20. Beam parts 22 are formed between the proof mass part 20 and the support part 18. One end of each beam part 22 is connected to the proof mass part 20 and the other end of the beam part 22 is connected to the support part 18.

The support part 18 is made of the front side silicon layer 8, the back side silicon layer 9, the buried oxide film 10, an interlayer insulation film 26 formed on the front side silicon layer 8, and the passivation film 27 formed on the interlayer insulation film 26. The front side silicon layer 8, the back side silicon layer 9, and the buried oxide film 10 constitute the SOI substrate. The wiring patterns 23 and electrode pads 25 are formed on the support part segment 2 of the interlayer insulation film 26. Parts of the passivation film 27 corresponding to the electrode pads 25 are removed, and therefore the electrode pads 25 are exposed on the front side of the semiconductor sensor.

The proof mass part 20 is made of the front side silicon layer 8, the back side silicon layer 9, the buried oxide film 10, the interlayer insulation film 26, and the passivation film 27. The front side silicon layer 8, the back side silicon layer 9, and the buried oxide film 10 make up the SOI substrate, which also constitutes a portion of the support part 18.

The thickness of the back side silicon layer 9 of the proof mass part 20 is less than the thickness of the back side silicon layer 9 of the support part 18. A base 16 is bonded by anodic bonding to the back side of the back side silicon layer 9 of the support part 18. A gap is provided between the proof mass part 20 and the base 16, making room for the proof mass part 20 to move.

The beam parts 22 are made of the front side silicon layer 8, which also constitutes portions of the proof mass part 20 and the support part 18, the interlayer insulation film 26, and the passivation film 27. The piezoresistors 24 are formed on the front side silicon layer 8 of the beam parts 22 by using a diffusion method used in semiconductor manufacturing. The wiring patterns 23 formed on the beam part segments 6 of the interlayer insulation film 26 are electrically connected through "through holes" (not shown) formed in the interlayer insulation film 26 to the piezoresistors 24.

In this conventional semiconductor sensor, the direction of the SOI substrate thickness is called the Z axis direction, the direction which is parallel to a plane orthogonal to the Z axis and parallel to a side of the support part 18 is called the X axis direction, and the direction which is parallel to the plane and perpendicular to the X direction is called the Y axis direction. The proof mass part 20 is suspended from the support part 18 by a pair of beam parts 22 formed in the X axis direction and a pair of beam parts 22 formed in the Y axis direction. Four piezoresistors 24 are formed on the pair of beam parts 22 formed in the X axis direction, two on each beam part 22. Each two piezoresistors are electrically connected by a wiring pattern 23 so as to form a bridge circuit for detecting the displacement in the X axis direction. Eight piezoresistors 22 are formed on the pair of beam parts 22 formed in the Y axis direction, four on each beam part 22. Each two piezoresistors 22 are electrically connected by a wiring pattern 23 so as to form two sets of bridge circuits for detecting the displacement in the Y axis and Z axis directions.

With a configuration as described above, when an external force (acceleration) containing a component in the X axis, Y axis, or Z axis direction is applied to the semiconductor sensor, the proof mass part 20 is bent due to inertia in relation to the support part 18. As a result, the beam parts 22 bend and the resistances of the piezoresistors 24 formed on the beam parts 22 change. Acceleration applied to the semiconductor sensor in the X axis, Y axis, and Z axis directions can be determined by detecting the changes in the resistances of the piezoresistors 24.

FIGS. 5A through 5F are cross-sectional views of the conventional semiconductor sensor shown in FIG. 4A, which cross-sectional views are used to describe a conventional semiconductor sensor production method. Steps (a) through (f) described below correspond to FIGS. 5A through 5F. In FIGS. 5A through 5F, illustration of the piezoresistors, metal wiring patterns, and passivation film is omitted.

Figure 5A:
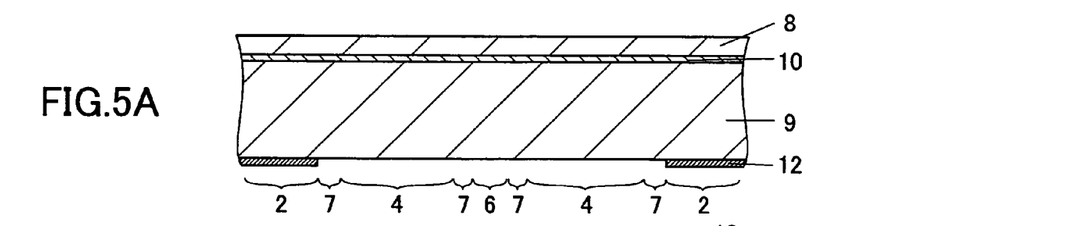
FIGS. 5A through 5F are cross-sectional views of the conventional semiconductor sensor shown in FIG. 4, which cross-sectional views are used to describe a conventional semiconductor sensor production method.

(a) A silicon oxide film is formed on the entire back side of the back side silicon layer 9 of the SOI substrate by using a plasma CVD method. A first etching mask layer 12 made of silicon oxide is formed on the support part segment 2 by selectively removing the silicon oxide film using a photolithography or etching technique.

Figure 5B:
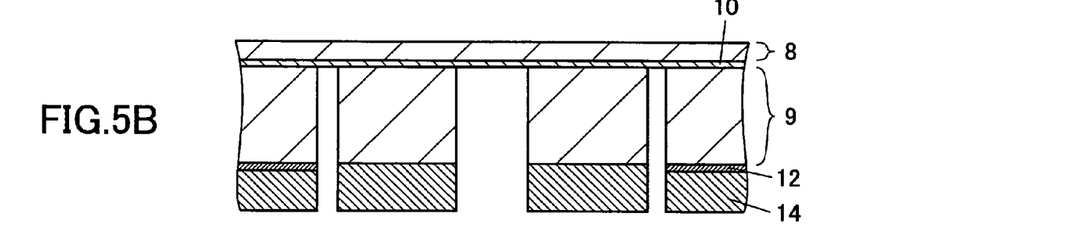

(b) A second etching mask layer 14 is formed on the first etching mask layer 12 and on the proof mass part segment 4 of the back side silicon layer 9 by using a photolithography technique. Dry etching is performed from the back side of the SOI substrate by using the second etching mask layer 14 as a mask. This dry etching is performed until the buried oxide film 10 in the segments other than the support part segment 2 and the proof mass part segment 4 is exposed on the back side of the SOI substrate.

Figure 5C:
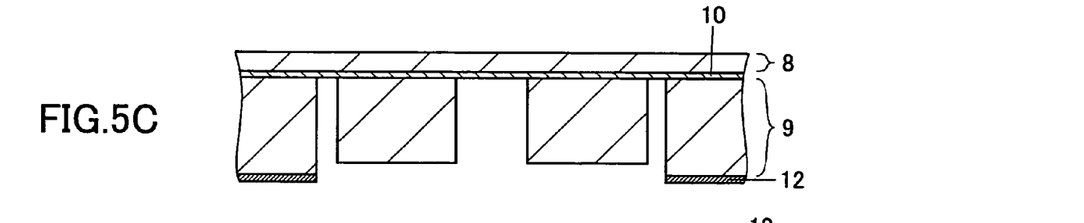

(c) The second etching mask layer 14 is removed. The thickness of the proof mass part segment 4 of the back side silicon layer 9 is reduced by etching a portion of the back side silicon layer 9 from the back side of the SOI substrate by using the first etching mask layer 12 as a mask.

Figure 5D:
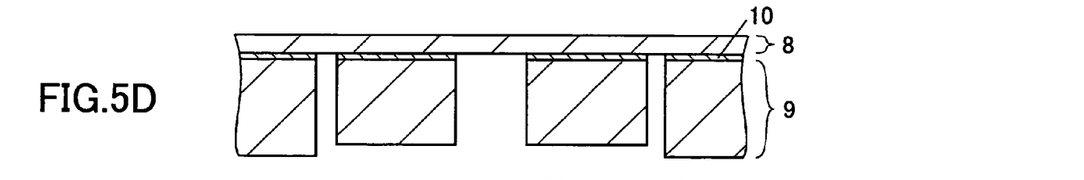

(d) The first etching mask layer 12 is removed by using a buffered hydrofluoric acid solution. In this step, the buried oxide film 10 exposed on the back side of the SOI substrate in the segments other than the support part segment 2 and the proof mass part segment 4 is also removed.

Figure 5E:
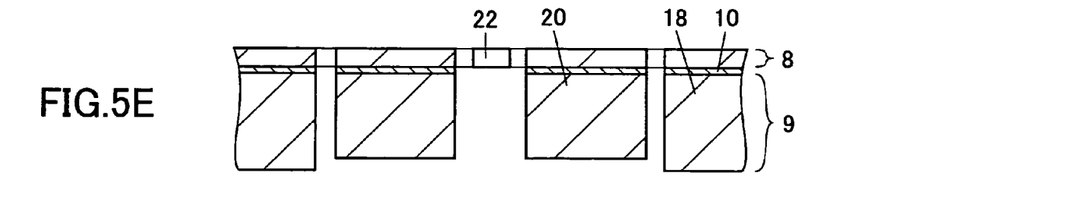

(e) A third etching mask layer (not shown) having openings in the opening segments 7 (segments other than the support part segment 2, the proof mass part segment 4, and the beam part segments 6) is formed on the front side silicon layer 8 of the SOI substrate by using a photolithography technique. The front side silicon layer 8 is selectively removed by performing dry etching using the third etching mask layer as a mask. As a result, the support part 18, the proof mass part 20, and the beam parts 22 are formed. After the dry etching is completed, the third etching mask layer is removed by oxygen plasma ashing.

Figure 5F:
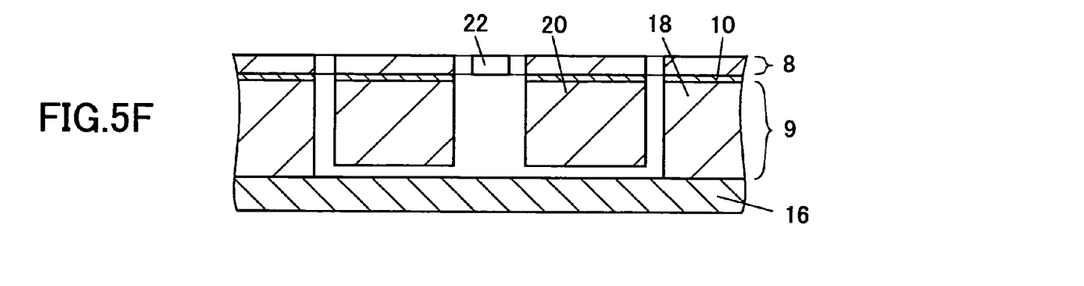

(f) A glass substrate as the base 16 is bonded by anodic bonding to the support part segment 2 of the back side silicon layer 9.

Since the proof mass part segment 2 of the back side silicon layer 9 has been etched in step (c), there is no need to form a concave portion on the glass substrate used as the base 16 in order to form a gap between the proof mass part 20 and the base 16. Therefore, a flat glass substrate can be used as the base 16.

[Patent document 1] Japanese Patent Application Publication No. 2005-49130

Figure 6:
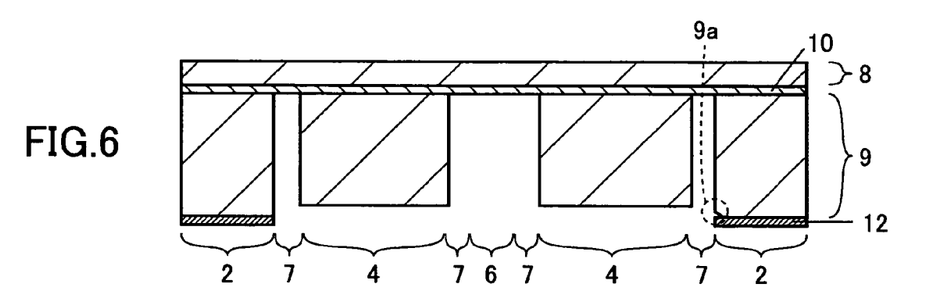
FIG. 6 is a cross-sectional view of a semiconductor sensor used to describe a problem in a conventional semiconductor sensor production method.

However, in the exemplary conventional semiconductor sensor production method described above with reference to FIGS. 5A through 5F, edges 9a of the support part segment 2 of the back side silicon layer 9 may be etched as shown in FIG. 6 during the dry etching processes in steps (b) and (c). As a result, a gap may be formed between the back side silicon layer 9 and the first etching mask layer 12.

If the wet etching process in step (d) is performed with such a gap, air bubbles may attach to the edges 9a of the back side silicon layer 9. These air bubbles may prevent complete removal of the first etching mask layer 12 and a portion of the first etching mask layer 12 may remain as an etching residue on the support part segment 2 of the back side silicon layer 9. Such an etching residue makes the back side of the support part 18 uneven, making it difficult to securely bond the base 16 and thereby lowering the yield.

Although dry etching may be used instead of wet etching to remove the first etching mask layer 12, since the buried oxide film 10 of the SOI substrate is positioned far from the back side of the support part 18, the buried oxide film 10 exposed on the back side of the SOI substrate and the first etching mask layer 12 cannot be removed at the same time with dry etching.

Figure 7:
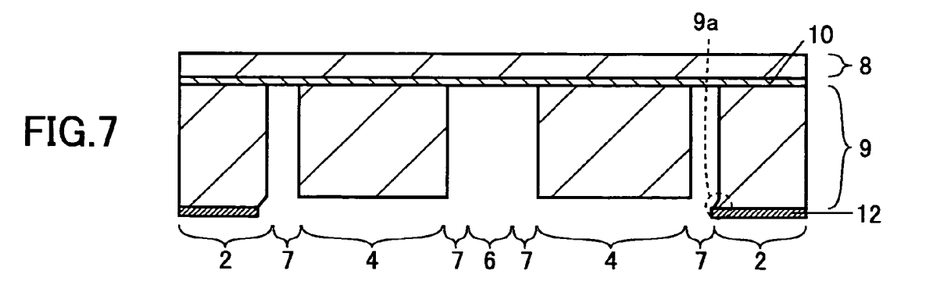
FIG. 7 is a cross-sectional view of a semiconductor sensor used to describe another problem in a conventional semiconductor sensor production method.

Also, since the first etching mask layer 12 and the second etching mask layer 14 have the same size as shown in FIG. 5B, if misalignment occurs in the photolithography process and the first etching mask layer 12 and the second etching mask layer 14 are misaligned, and if the second etching mask layer 14 is removed in such a condition, a portion of the first etching mask layer 12 may protrude as shown in FIG. 7 from the support part segment 2 of the back side silicon layer 9. If wet etching is performed with such a protrusion 9a of the first etching mask layer 12 as shown in FIG. 7, air bubbles may attach to the protrusion 9a. These air bubbles may prevent complete removal of the first etching mask layer 12 and a portion of the first etching mask layer 12 may remain as an etching residue on the back side of the support part 18. Such an etching residue makes it difficult to securely bond the base 16, thereby lowering the yield in semiconductor sensor manufacturing.

SUMMARY OF THE INVENTION

The present invention provides a semiconductor sensor production method and a semiconductor sensor that substantially obviate one or more problems caused by the limitations and disadvantages of the related art.

Embodiments of the present invention particularly provide a semiconductor sensor production method which enables secure bonding of a base to the back side of a semiconductor sensor and which thereby improves the yield in semiconductor sensor manufacturing.

According to an embodiment of the present invention, a method of producing a semiconductor sensor including a proof mass part, a support part formed around the proof mass part, and beam parts connecting the proof mass part and the support part, wherein an SOI substrate including a front side semiconductor layer, back side semiconductor layer, and a buried oxide film formed between the front side semiconductor layer and the back side semiconductor layer is used, includes the steps of (A) forming a first etching mask layer on a support part segment, which is to be formed into the support part, of the backside semiconductor layer, except on a portion of the support part segment which portion is along edges of the support part segment; (B) forming a second etching mask layer on the support part segment of the backside semiconductor layer including where the first etching mask layer is formed in the step (A), and on a proof mass part segment, which is to be formed into the proof mass part, of the back side semiconductor layer; (C) selectively removing segments of the back side semiconductor layer between the proof mass part segment and the support part segment by performing etching from a back side of the SOI substrate using the second etching mask layer as a mask; (D) making the proof mass part segment of the back side semiconductor layer thinner than the support part segment of the back side semiconductor layer by removing the second etching mask layer and subsequently performing etching on the back side semiconductor layer from the back side of the SOI substrate using the first etching mask layer as a mask; and (E) removing the first etching mask layer by using a wet etching method.

As described above, in a semiconductor sensor production method according to an embodiment of the present invention, the first etching mask layer, which is used to make the proof mass part segment of the back side semiconductor layer thinner than the support part segment of the back side semiconductor layer by selectively etching the proof mass part segment of the back side semiconductor layer, is formed in step (A) on the support part segment of the backside semiconductor layer except on a portion of the support part segment which portion is along edges of the support part segment and is adjacent to the proof mass part segment. As a result, the area of the first etching mask layer on the support part segment becomes smaller than the area of the second etching mask layer formed in step (B) on the support part segment. In other words, the portion along edges of the support part segment is covered by the second etching mask layer. Therefore, when the second etching mask layer is removed after selectively removing the back side semiconductor layer using the second etching mask layer as a mask in step (C), the portion along edges of the support part segment of the back side semiconductor layer becomes exposed. In step (D), etching is performed on the back side semiconductor layer using the first etching mask layer as a mask. As a result, the edges of the support part segment of the back side semiconductor layer are etched together with the proof mass part segment of the back side semiconductor layer, and therefore become beveled. These steps prevent air bubbles from adhering to the edges of the support part segment of the back side semiconductor layer during wet etching in step (E).

The first etching mask layer formed in step (A) is preferably made of silicon oxide, and the buried oxide film exposed on the back side of the SOI substrate is preferably removed together with the first etching mask layer in the step (E).

According to an aspect of the present invention, a semiconductor sensor production method described above may further include after step (E) the steps of (F) bonding a flat glass plate to a back side of the support part segment of the back side semiconductor layer; (G) forming a third etching mask layer on the proof mass part segment, the beam part segments, and the support part segment of the front side semiconductor layer; and (H) forming the proof mass part, the beam parts, and the support part by performing etching from a front side of the SOI substrate using the third etching mask layer as a mask.

According to an embodiment of the present invention, a semiconductor sensor includes a proof mass part; a support part formed around the proof mass part; and beam parts connecting the proof mass part and the support part, wherein an SOI substrate including a front side semiconductor layer, back side semiconductor layer, and a buried oxide film formed between the front side semiconductor layer and the back side semiconductor layer is used, and edges of the back side semiconductor layer of the support part are beveled.

In a semiconductor sensor production method according to an embodiment of the present invention, a first etching mask layer is formed on a support part segment of a back side semiconductor layer of an SOI substrate except on a portion of the support part segment which portion is along edges of the support part segment and adjacent to a proof mass part segment [step (A)]; a second etching mask layer is formed on the support part segment of the back side semiconductor layer including where the first etching mask layer is formed and on a proof mass part segment of the back side semiconductor layer, which second etching mask layer is used to define the proof mass part segment and the support part segment, and segments of the back side semiconductor layer between the proof mass part segment and the support part segment are removed by performing etching from the back side of the SOI substrate [steps (B) and (C)]; and, after removing the second etching mask layer, the proof mass part segment of the back side semiconductor layer is etched using the first etching mask layer as a mask [step (D)]. Since the portion along the edges of the support part segment is not covered by the first etching mask layer, the edges are etched in step (D) together with the proof mass part segment of the back side semiconductor layer and become beveled. These steps prevent air bubbles from adhering to the edges of the support part segment of the back side semiconductor layer during wet etching, thereby enabling complete removal of the first etching mask layer by the wet etching. This makes it possible to securely bond a base to the back side semiconductor layer and thereby improves the yield in semiconductor sensor manufacturing.

Also, in a semiconductor sensor production method according to an embodiment of the present invention, the first and second etching mask layers are not formed in exactly the same area. This provides a larger margin for misalignment during a photolithography process, thereby reducing the number of retries.

Forming a silicon oxide film as the first etching mask layer in step (A) and removing the buried oxide film exposed on the back side of the SOI substrate together with the first etching mask layer in the step (E) eliminate the need for a step dedicated for removing the buried oxide film in segments such as the beam part segments where the buried oxide film is no longer necessary.

When removing the buried oxide film, if wet etching is performed with air bubbles adhering to the SOI substrate, a portion of the buried oxide film on the back side of a beam part, for example, may remain as residue. Such residue may affect the way the beam part bends, thereby decreasing the sensitivity of a semiconductor sensor. In a semiconductor sensor production method according to an embodiment of the present invention, since edges of the support part segment of the back side semiconductor layer are beveled, air bubbles can be removed completely from the SOI substrate and as a result the buried oxide film exposed on the back side can be removed completely. Thus, a semiconductor sensor production method according to an embodiment of the present invention prevents etching residue and thereby prevents decrease in sensitivity of a semiconductor sensor.

The semiconductor sensor production method described above may further include after step (E) the steps of (F) bonding a flat glass plate to the support part segment of the back side semiconductor layer; (G) forming a third etching mask layer on the proof mass part segment, the beam part segments, and the support part segment of the front side semiconductor layer; and (H) forming the proof mass part, the beam parts, and the support part by performing dry etching from the front side of the SOI substrate using the third etching mask layer as a mask. In these steps, the dry etching is performed after enhancing with the flat glass plate the strength of the SOI substrate which has been weakened by etching on the back side semiconductor layer. Therefore, these steps make it possible to form the proof mass part, the beam parts, and the support part without damaging the SOI substrate.

As described above, a semiconductor sensor production method according to an embodiment of the present invention provides a semiconductor sensor in which no etching residue is on the back side of the support part and the base is securely bonded to the back side of the support part.

DESCRIPTION OF THE PREFERRED EMBODIMENTS

Preferred embodiments of the present invention are described below with reference to accompanying drawings.

Figure 1A:
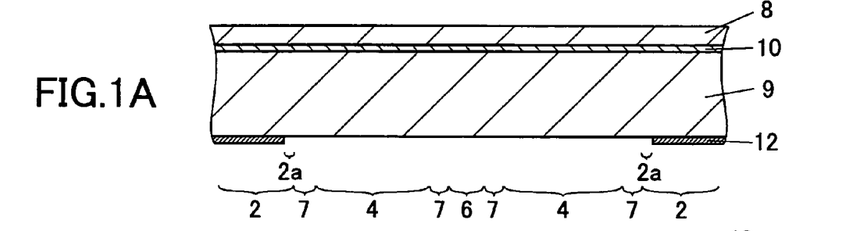
FIGS. 1A through 1F are cross-sectional views of a semiconductor sensor, which cross-sectional views are used to describe a semiconductor sensor production method according to an embodiment of the present invention.
Figure 1B:
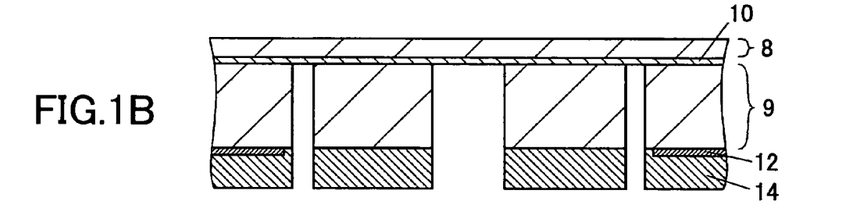
Figure 1C:
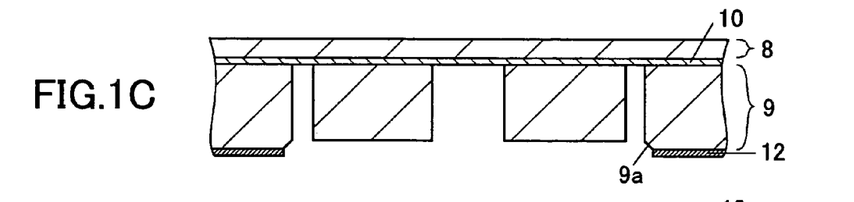
Figure 1D:
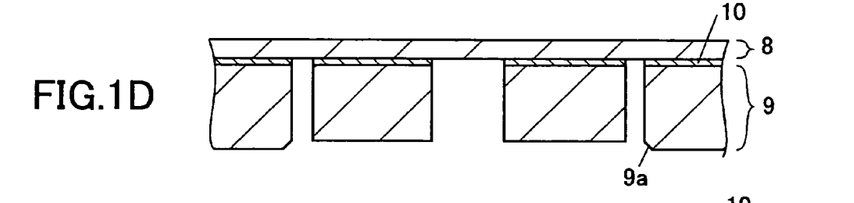
Figure 1E:
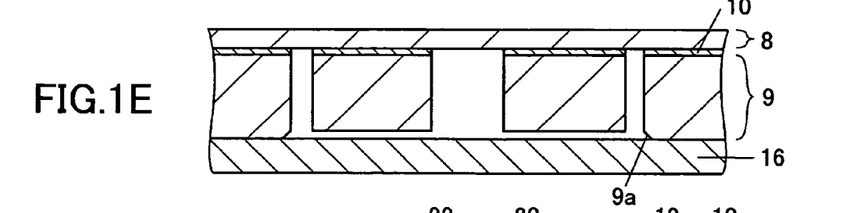
Figure 1F:
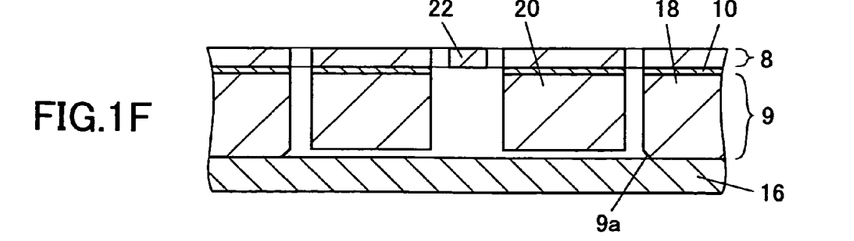
Figure 2A:
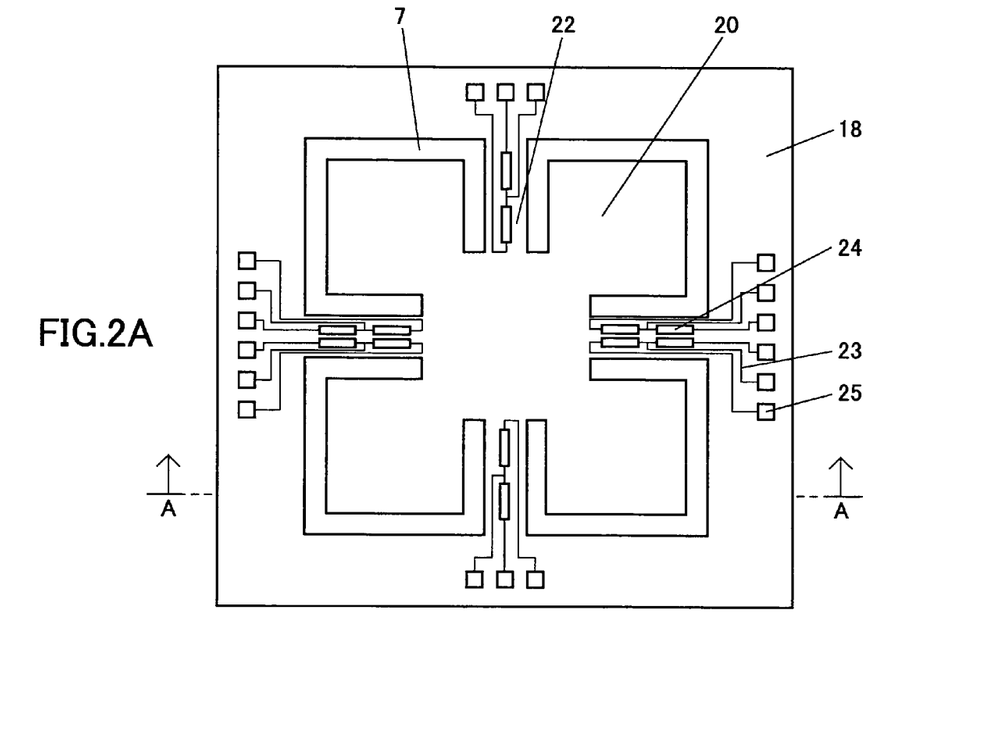
FIG. 2A is a plan view of an exemplary semiconductor sensor produced by using a semiconductor sensor production method according to an embodiment of the present invention.
Figure 2B:
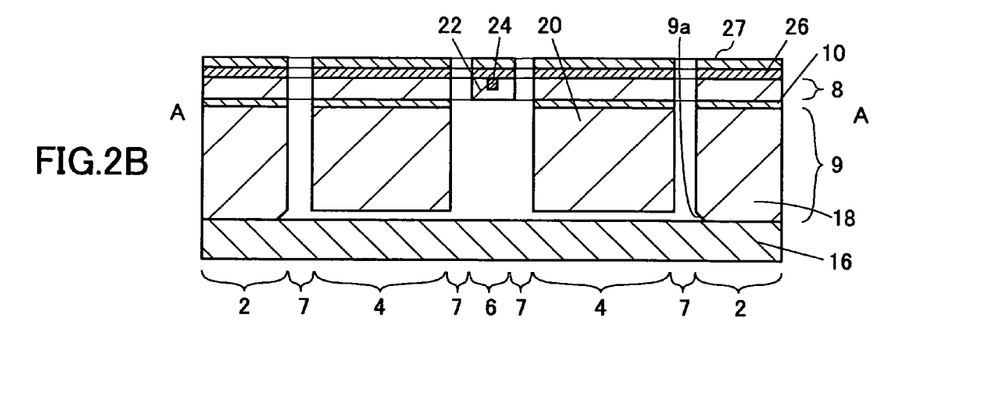
FIG. 2B is a cross-sectional view of the exemplary semiconductor sensor taken along line A-A shown in FIG. 2A.

FIGS. 1A through 1F are cross-sectional views of a semiconductor sensor, which cross-sectional views are used to describe a semiconductor sensor production method according to an embodiment of the present invention. FIG. 2A is a plan view of an exemplary semiconductor sensor produced by using a semiconductor sensor production method according to an embodiment of the present invention. FIG. 2B is a cross-sectional view of the exemplary semiconductor sensor taken along line A-A shown in FIG. 2A.

In FIGS. 1 and 2, 2 indicates a support part segment, 4 indicates a proof mass part segment, 6 indicates a beam part segment, 7 indicates an opening segment where SOI substrate material is removed in the thickness direction, 8 indicates a front side silicon layer (front side semiconductor layer) of the SOI substrate, 9 indicates a back side silicon layer (back side semiconductor layer) of the SOI substrate, and 10 indicates a buried oxide film formed between the front side silicon layer 8 and the back side silicon layer 9. In FIGS. 1A through 1F, illustration of piezoresistors, metal wiring patterns, and a passivation film is omitted. In FIG. 2A, illustration of a passivation film 27 is omitted, and, instead, wiring patterns 23 and piezoresistors 24 formed on the front side silicon layer 8 are illustrated.

An exemplary semiconductor sensor according to an embodiment of the present invention is described below with reference to FIG. 2.

The exemplary semiconductor sensor in this embodiment includes a proof mass part 20 which is bent according to acceleration applied to the semiconductor sensor. A support part 18 is formed around the proof mass part 20. The opening segments 7 are positioned between the support part 18 and the proof mass part 20. Beam parts 22 are formed between the support part 18 and the proof mass part 20. On the beam parts 22, multiple piezoresistors 24 are formed. As the beam parts 22 bend, the resistances of the piezoresistors 24 change. A flat glass substrate as a base 16 is bonded to the back side of the support part 18.

The support part 18, the proof mass part 20, and the beam parts 22 are formed by processing one SOI substrate. Therefore, the support part 18, the proof mass part 20, and the beam parts 22 are connected through the front side silicon layer 8 which constitutes a portion of the SOI substrate.

The support part 18 is made of the front side silicon layer 8, the back side silicon layer 9, the buried oxide film 10, an interlayer insulation film 26 formed on the front side silicon layer 8, the wiring patterns 23 and electrode pads 25 formed on the interlayer insulation film 26, and the passivation film 27 formed on the wiring patterns 23 and the electrode pads 25. The front side silicon layer 8, the back side silicon layer 9, and the buried oxide film 10 constitute the SOI substrate. Parts of the passivation film 27 corresponding to the electrode pads 25 are open, and therefore the electrode pads 25 are exposed on the front side of this semiconductor sensor.

The proof mass part 20 is made of the front side silicon layer 8, the back side silicon layer 9, the buried oxide film 10, the interlayer insulation film 26, and the passivation film 27. The front side silicon layer 8, the back side silicon layer 9, and the buried oxide film 10 make up the SOI substrate, which also constitutes a portion of the support part 18.

The thickness of the back side silicon layer 9 of the proof mass part 20 is less than the thickness of the back side silicon layer 9 of the support part 18. Edges 9a of the back side silicon layer 9 of the support part 18 are beveled. The base 16 is bonded by anodic bonding to the back side of the back side silicon layer 9 of the support part 18. A gap is provided between the proof mass part 20 and the base 16, making room for the proof mass part 20 to move.

The beam parts 22 are made of the front side silicon layer 8 which also constitutes portions of the proof mass part 20 and the support part 18, the interlayer insulation film 26, and the passivation film 27. The piezoresistors 24 are formed on the front side silicon layer 8 of the beam parts 22 by using a diffusion method used in semiconductor manufacturing. The wiring patterns 23 formed on the beam part segments 6 of the interlayer insulation film 26 are electrically connected through "through holes" (not shown) formed in the interlayer insulation film 26 to the piezoresistors 24.

An exemplary method of producing the semiconductor sensor shown in FIG. 2 is described below with reference to FIGS. 1A through 1F. Steps (a) through (f) described below correspond to FIGS. 1A through 1F. FIGS. 1A through 1F are cross-sectional views of the exemplary semiconductor sensor taken along line A-A shown in FIG. 2A.

Before step (a), the piezoresistors 24 are formed on the beam part segments 6 of the front side silicon layer 8 by using a diffusion method used in semiconductor manufacturing. Then, the interlayer insulation film 26 is formed on the front side silicon layer 8, and the wiring patterns 23 and the electrode pads 25 are formed on the interlayer insulation film 26. Also, the passivation film 27 is formed on the interlayer insulation film 26 having the wiring patterns 23 and the electrode pads 25.

(a) A polybenzoxazole (PBO) film (not shown) is formed on the passivation film 27, and a silicon oxide film (not shown) is formed on the PBO film. The PBO film and the silicon oxide film function as protective films against a chemical such as hydrofluoric acid, as protective films for preventing scratches on the sides of the piezoresistors 24, and as films for reinforcing the wafer. A silicon oxide film is formed on the entire back side of the back side silicon layer 9 by using a plasma CVD method. A first etching mask layer 12 is formed on the support part segment 2 excluding a frame-shaped portion 2a along edges of the support part segment which edges are adjacent to the proof mass part segment 4 (an area slightly smaller than the support part segment 2) by selectively removing the silicon oxide film using a photolithography technique. For example, the first etching mask layer 12 may be formed in an area obtained by excluding a 3 μm-wide area along the edges of the support part segment 2 from the support part segment 2, which edges are adjacent to the proof mass part segment 4.

(b) A resist mask as a second etching mask layer 14 is formed on the support part segment 2 of the back side silicon layer 9 including where the first etching mask layer 12 is formed and on the proof mass part segment 4 of the back side silicon layer 9 by using a photolithography technique. Dry etching is performed from the back side of the SOI substrate by using the second etching mask layer 14 as a mask. In this dry etching process, the buried oxide film 10 formed between the front side silicon layer 8 and the back side silicon layer 9 is used as an etching stopper layer. The dry etching is performed until the buried oxide film 10 in the segments other than the support part segment 2 and the proof mass part segment 4 is completely exposed on the back side of the SOI substrate.

In the above described dry etching process, for example, an inductive coupled plasma (ICP) dry etching apparatus may be used.

When an ICP dry etching apparatus is used, an SOI substrate is positioned so that the back side of the SOI substrate faces the plasma chamber, an etching gas formed by mixing sulfur hexafluoride ($SF_6$) and oxygen in the proportion of 450 cc to 450 cc is supplied to the chamber, the pressure in the chamber is maintained at 90 mTorr (about 12 Pa), and high-frequency power of 2700 W is applied for nine seconds to the plasma generating coil. Such a condition causes physico-chemical reactions between silicon to be removed and radicals and etching gas ions, resulting in removal of the silicon.

After the above step, supply of $SF_6$ is stopped and instead 200 cc of perfluorocyclobutane ($C_4F_8$) is supplied to the chamber, and the pressure in the chamber is maintained at 30 mTorr (about 4 Pa), then, high-frequency power of 2200 W is applied for three seconds to the plasma generating coil to remove reaction products produced in the silicon removal step.

In such a dry etching apparatus, specified areas of the back side silicon layer 9 are anisotropically etched by repeating the 9-second silicon removal step and the 3-second reaction product removal step described above.

(c) The second etching mask layer 14 is removed. The proof mass part segment 4 of the back side silicon layer 9 is etched from the back side of the SOI substrate by using the first etching mask layer 12 as a mask. In the above step, since the frame-shaped portion 2a of the back side silicon layer 9, which portion 2a is along the edges of the support part segment 2 and adjacent to the proof mass part segment 4, is not covered by the first etching mask layer 12, the edges are also etched and beveled edges 9a are formed. The thickness to be etched of the proof mass part segment 4 of the back side silicon layer 9 is determined depending on the width of the gap to be formed between the proof mass part 20 and the base 16 to be bonded to the back side of the SOI substrate.

This etching process can be performed in a similar manner as described in step (b) by using an ICP dry etching apparatus. Also, the etching process can be performed by using a wet etching method with an alkaline solution such as tetramethyl ammonium hydroxide (TMAH) or by using another dry etching method such as reactive ion etching (RIE).

(d) The first etching mask layer 12 is removed by using a buffered hydrofluoric acid solution. In this step, the buried oxide film 10 exposed on the back side of the SOI substrate in the segments other than the support part segment 2 and the proof mass part segment 4 is also removed.

Since the PBO film (not shown) is formed as a protective film on the passivation film 27, the silicon oxide film (not shown) formed on the PBO film over the wiring patterns 23 is not etched by the buffered hydrofluoric acid solution.

In this wet etching process, since the edges 9a of the support part segment 2 of the back side silicon layer 9 are beveled, no air bubble attaches to the edges 9a. Therefore, the first etching mask layer 12 can be removed completely.

After the first etching mask layer 12 is removed, the back side silicon layer 9 is observed with a microscope or the like to confirm that there is no residual first etching mask layer 12.

(e) A glass substrate as the base 16 is bonded by anodic bonding to the support part segment 2 of the back side silicon layer 9. The base 16 enhances the strength of the SOI substrate which has been weakened after being etched deep from the back side.

Since the proof mass part segment 2 of the back side silicon layer 9 has been etched in step (c), there is no need to form a concave portion on the glass substrate used as the base 16 in order to form a gap between the proof mass part 20 and the base 16. Therefore, a flat glass substrate can be used as the base 16. For a glass substrate, glass which can be bonded by anodic bonding to the SOI substrate, such as Pyrex (registered trademark) glass or Tempax (registered trademark) glass, may be used.

In this embodiment, Pyrex (registered trademark) glass is used for the base 16. In anodic bonding, the SOI substrate is placed on the base 16, they are heated to 325° C. for example, and a DC voltage of 250 V, for example, is applied between the SOI substrate (positive) and the base 16 (negative). As a result, the base 16 is bonded to the support part segment 2 of the back side silicon layer 9. The temperature during the anodic bonding is preferably about 325° C. With this temperature, distortion of the SOI substrate, which occurs when the SOI substrate is cooled to its normal temperature after the anodic bonding, can be minimized.

After the base 16 is bonded by anodic bonding to the back side of the SOI substrate, the base 16 is water-washed by brush-scrubbing to remove sodium compound which adheres to the base 16 during anodic bonding.

(f) After the PBO film (not shown) formed on the front side of the SOI substrate is removed by oxygen plasma ashing, a third etching mask layer (not shown) having openings in the opening segments 7 (segments between the support part segment 2, the proof mass part segment 4, and the beam part segments 6) is formed on the front side silicon layer 8 of the SOI substrate by using a photolithography technique. The front side silicon layer 8 is selectively removed by performing dry etching using the third etching mask layer as a mask. As a result, the support part 18, the proof mass part 20, and the beam parts 22 are formed. After the dry etching is completed, the third etching mask layer is removed by oxygen plasma ashing.

This dry etching process may also be used to expose the electrode pads 25 on the front side of the support part segment 2. In this case, the layers above the electrode pads 25 and the opening segments 7 of the front side silicon layer 8 are removed at the same time by using the third etching mask layer having openings also in the areas corresponding to the electrode pads 25 formed near the front side of the support part segment 2.

When a dry etching apparatus using an electrostatic chuck is employed in step (f), it is preferable to form a metal film made of, for example, aluminum under the base 16 before the dry etching. In a dry etching apparatus using an electrostatic chuck, the base 16 on the back side of the SOI substrate is fixed to the etching stage by electrostatic force. During dry etching, electric charges accumulate on the glass substrate of the base 16. Even after the dry etching, these electric charges sometimes make it difficult to remove the base 16 from the etching stage. The metal layer formed under the base 16 helps the base 16 release the electric charges, thereby making it easier to remove the base 16 from the etching stage after the dry etching.

Such a metal film may be formed by using a sputtering method or an evaporation method. The thickness of the metal film may be about 0.1 μm. A conductive material other than aluminum may be used as the material for the metal film. Also, a transparent conductive film such as an ITO (indium, tin, and oxide) film may be used so that the silicon surface after bonding the glass substrate can be observed. Such a transparent conductive film may be deposited on the glass substrate before bonding.

Although the buried oxide film 10 exposed on the back side of the SOI substrate in the beam part segments 6 and the opening segments 7 is removed in step (d) together with the first etching mask layer 12 in this embodiment, the buried oxide film 10 and the first etching mask layer 12 may be removed in separate steps.

Also, although dry etching is performed on the opening segments 7 in step (f) after the base 16 is bonded to the support part segment 2 of the back side silicon layer 9 in step (e) of this embodiment, the dry etching may be performed before the base 16 is bonded to the support part segment 2 of the back side silicon layer 9. However, performing the dry etching on the opening segments 7 before bonding the base 16 to the support part segment 2 of the back side silicon layer 9 may damage the beam part segments 6, since the strength of the SOI substrate is low. Therefore, it is preferable to perform the dry etching after bonding the base 16.

Figure 3A:
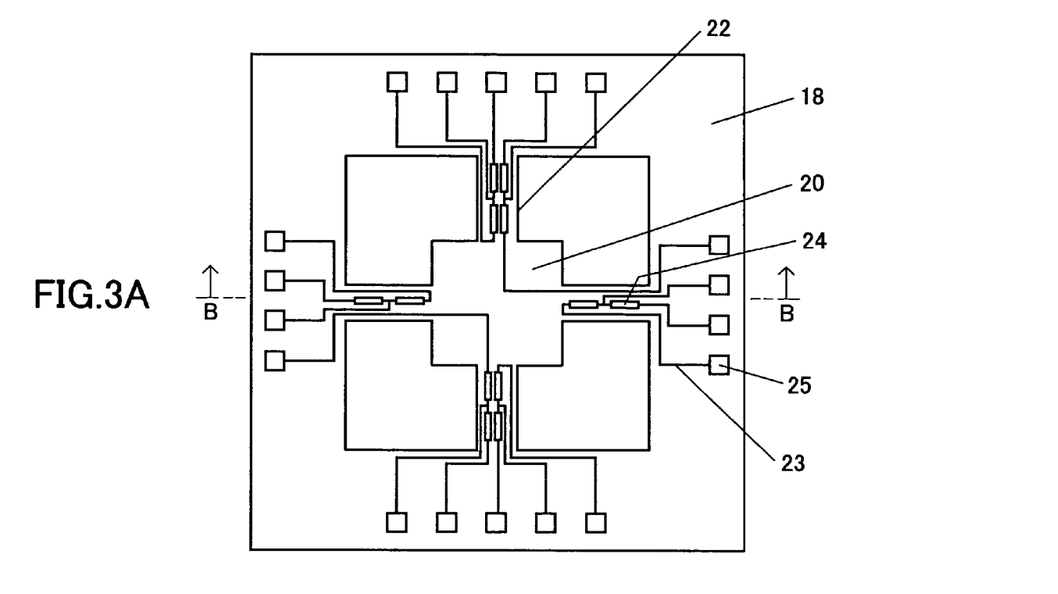
FIG. 3A is a plan view of an exemplary semiconductor sensor produced by using a semiconductor sensor production method according to another embodiment of the present invention.
Figure 3B:
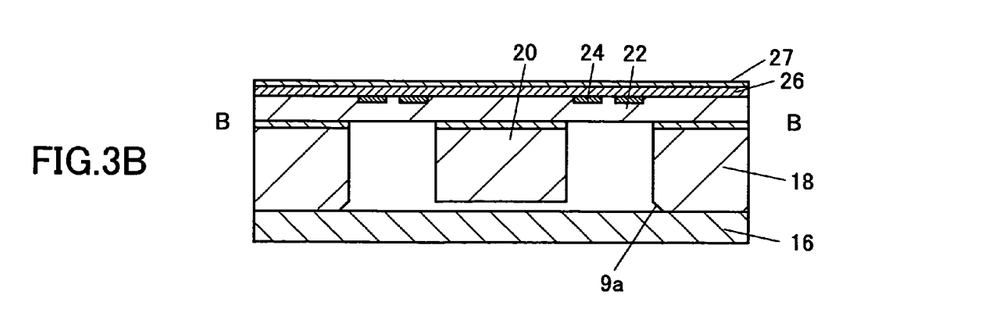
FIG. 3B is a cross-sectional view of the exemplary semiconductor sensor taken along line B-B shown in FIG. 3A.

The present invention may also be applied to a semiconductor sensor having a proof mass part 20 as shown in FIG. 3, which proof mass part 20 has a shape different from that of the proof mass part 20 shown in FIG. 2. Further, the present invention may be applied to a semiconductor sensor in which the number and/or layout of the wiring patterns 23, the piezoresistors 24, and/or the electrode pads 25 are different from those in the semiconductor sensor shown in FIG. 2.

The present invention is not limited to the specifically disclosed embodiments, and variations and modifications may be made without departing from the scope of the present invention.

The present application is based on Japanese Priority Application No. 2005-220006, filed on Jul. 29, 2005, the entire contents of which are hereby incorporated herein by reference.

What is claimed is:

1. A method of producing a semiconductor sensor including a proof mass part, a support part formed around the proof mass part, and beam parts connecting the proof mass part and the support part, wherein an SOI substrate including a front side semiconductor layer, a back side semiconductor layer, and a buried oxide film formed between the front side semiconductor layer and the back side semiconductor layer is used, comprising the steps of:
   (A) forming a first etching mask layer on a support part segment, which support part segment is to be formed into the support part, of the backside semiconductor layer, except on a portion of the support part segment which portion is along edges of the support part segment;
   (B) forming a second etching mask layer on the support part segment of the backside semiconductor layer including where the first etching mask layer is formed in the step (A), and on a proof mass part segment, which proof mass part segment is to be formed into the proof mass part, of the back side semiconductor layer;
   (C) selectively removing other segments of the back side semiconductor layer between the proof mass part segment and the support part segment by performing etching from a back side of the SOI substrate using the second etching mask layer as a mask;
   (D) making the proof mass part segment of the back side semiconductor layer thinner than the support part segment of the back side semiconductor layer by removing the second etching mask layer and subsequently performing etching on the back side semiconductor layer from the back side of the SOI substrate using the first etching mask layer as a mask; and
   (E) removing the first etching mask layer by using a wet etching method.

2. The method of producing a semiconductor sensor as claimed in claim 1, wherein
   the first etching mask layer formed in the step (A) is made of silicon oxide; and
   the buried oxide film exposed on the back side of the SOI substrate is removed together with the first etching mask layer in step (E).

3. The method of producing a semiconductor sensor as claimed in claim 2, further comprising, after step (E) the steps of:
   (F) bonding a flat glass plate to the support part segment of the back side semiconductor layer;
   (G) forming a third etching mask layer on the proof mass part segment, beam part segments which beam part segments are to be formed into the beam parts, and the support part segment of the front side semiconductor layer; and
   (H) forming the proof mass part, the beam parts, and the support part by performing etching from a front side of the SOI substrate using the third etching mask layer as a mask.

4. The method of producing a semiconductor sensor as claimed in claim 1, further comprising, after step (E), the steps of:
   (F) bonding a flat glass plate to the support part segment of the back side semiconductor layer;
   (G) forming a third etching mask layer on the proof mass part segment, beam part segments which beam part segments are to be formed into the beam parts, and the support part segment of the front side semiconductor layer; and
   (H) forming the proof mass part, the beam parts, and the support part by performing etching from a front side of the SOI substrate using the third etching mask layer as a mask.

* * * * *